United States Patent [19]
Miyata et al.

[11] Patent Number: 5,198,752
[45] Date of Patent: Mar. 30, 1993

[54] ELECTRIC PROBING-TEST MACHINE HAVING A COOLING SYSTEM

[75] Inventors: Eiji Miyata, Fuchu; Masahiko Sugiyama, Nirasaki; Masahiko Kohno; Masataka Hatta, both of Yamanashi, all of Japan

[73] Assignee: Tokyo Electron Limited, Tokyo, Japan

[21] Appl. No.: 738,304

[22] Filed: Jul. 31, 1991

Related U.S. Application Data

[60] Division of Ser. No. 512,105, Apr. 20, 1990, Pat. No. 5,084,671, which is a continuation-in-part of Ser. No. 298,302, Jan. 17, 1989, abandoned, which is a continuation-in-part of Ser. No. 236,749, Aug. 26, 1988, abandoned.

[30] Foreign Application Priority Data

Sep. 2, 1987 [JP] Japan ............... 62-135000[U]

[51] Int. Cl.$^5$ .................................... G01R 1/02
[52] U.S. Cl. ........................ 324/158 F; 324/158 R; 165/80.4; 374/11
[58] Field of Search ............... 374/11, 13, 45; 165/80.4; 324/158 R, 158 F, 158 P

[56] References Cited

U.S. PATENT DOCUMENTS

| | | | |
|---|---|---|---|
| 3,710,251 | 1/1973 | Hagge et al. | 324/158 F |
| 3,979,671 | 9/1976 | Meeker et al. | 324/158 F |
| 4,567,432 | 1/1986 | Buol et al. | 324/158 F |
| 4,570,360 | 2/1986 | Nakagomi . | |
| 4,604,572 | 8/1986 | Horiuchi et al. . | |
| 4,607,220 | 8/1986 | Hollman | 324/158 F |
| 4,734,872 | 3/1988 | Eager et al. . | |
| 4,787,752 | 11/1988 | Fraser et al. | 324/158 F |

OTHER PUBLICATIONS

"Counter-Flow Cooling System", by Chu, IBM Tech. Disc. Bull., vol. 8, #11, Apr. 1966, p. 1692, cl. 165-80.4.

Primary Examiner—Ernest F. Karlsen
Assistant Examiner—William J. Burns
Attorney, Agent, or Firm—Oblon, Spivak, McClelland, Maier & Neustadt

[57] ABSTRACT

An electric probing-test machine comprises a probe card having a plurality of probes contacted with chips of a semiconductor wafer and serving to apply test signal to a tester which judges whether circuits on the chips of the wafer are correct or deficient, a main chuck for holding the wafer at a test temperature, a system for cooling the main chuck, and a controller for controlling the cooling system. The main chuck includes a chuck top contacted directly with the wafer, a jacket arranged to conduct heat exchange relative to the chuck top, and a temperature sensor for detecting the temperature of the chuck top. The cooling system has a pump for supplying a coolant from a reservoir to the jacket. Responsive to temperature information detected by the temperature sensor, the amount of the coolant supplied from the reservoir to the jacket is controlled by the controller to thereby control the temperature of the chuck top.

6 Claims, 14 Drawing Sheets

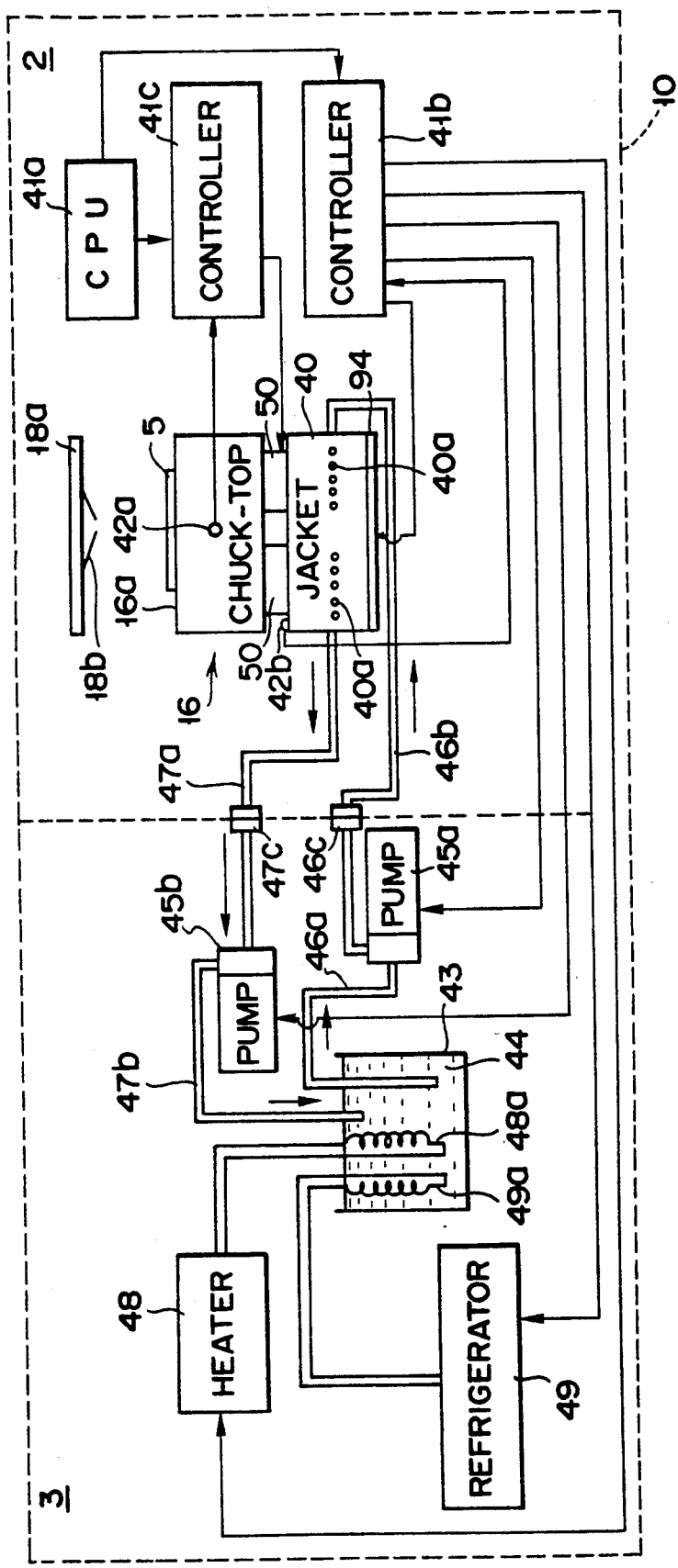
F I G. 3

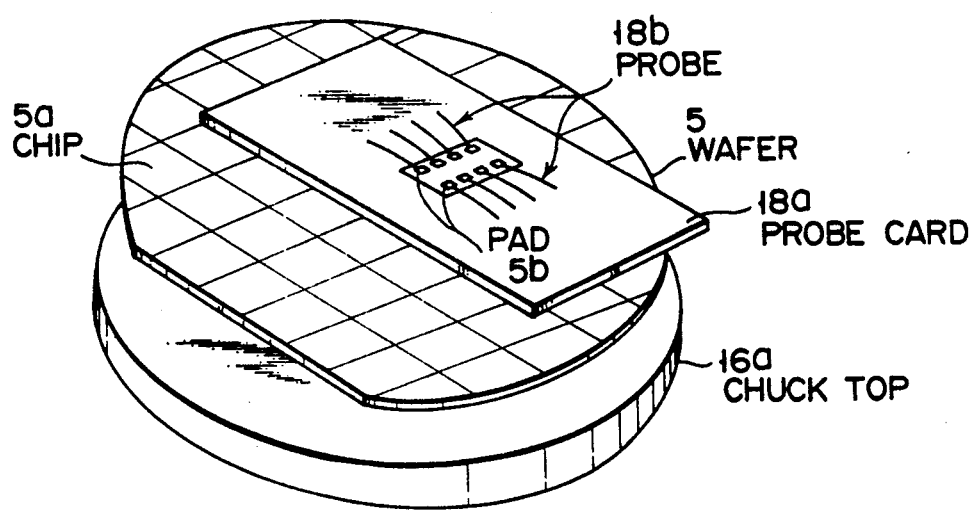
F I G. 4
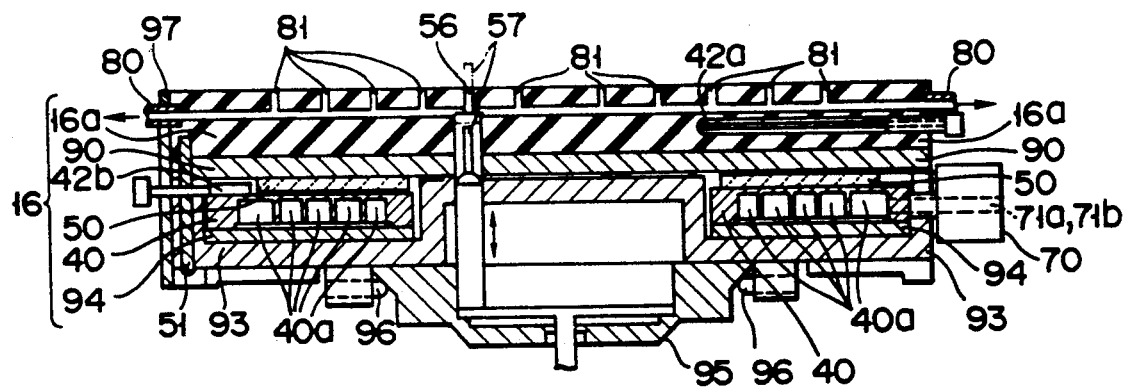
F I G. 5

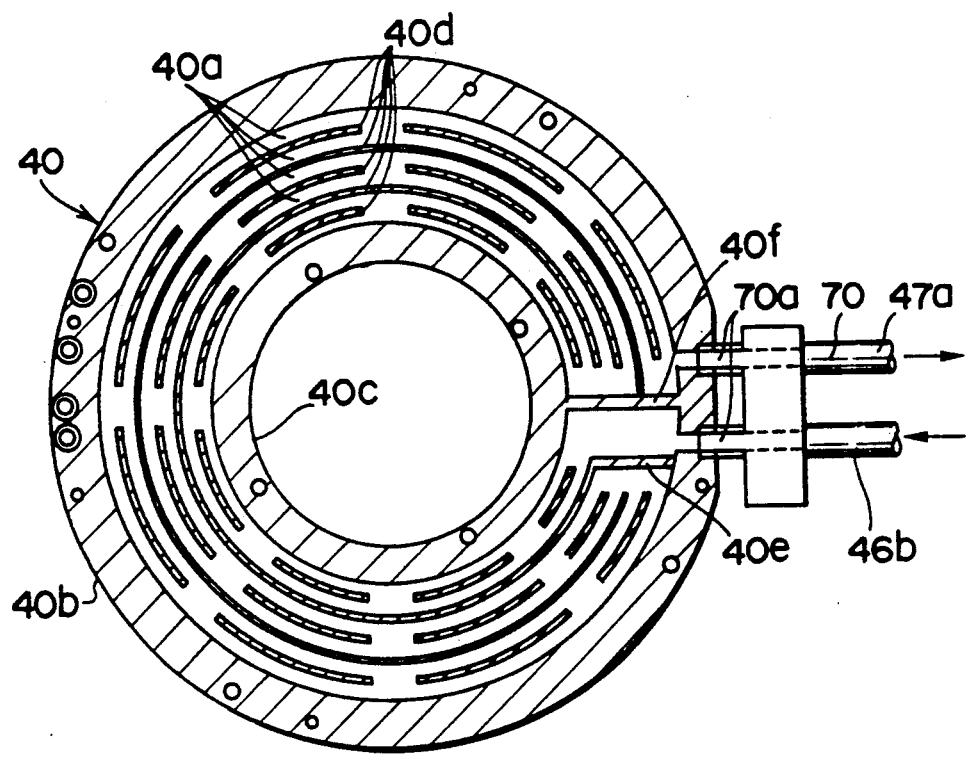
F I G. 6
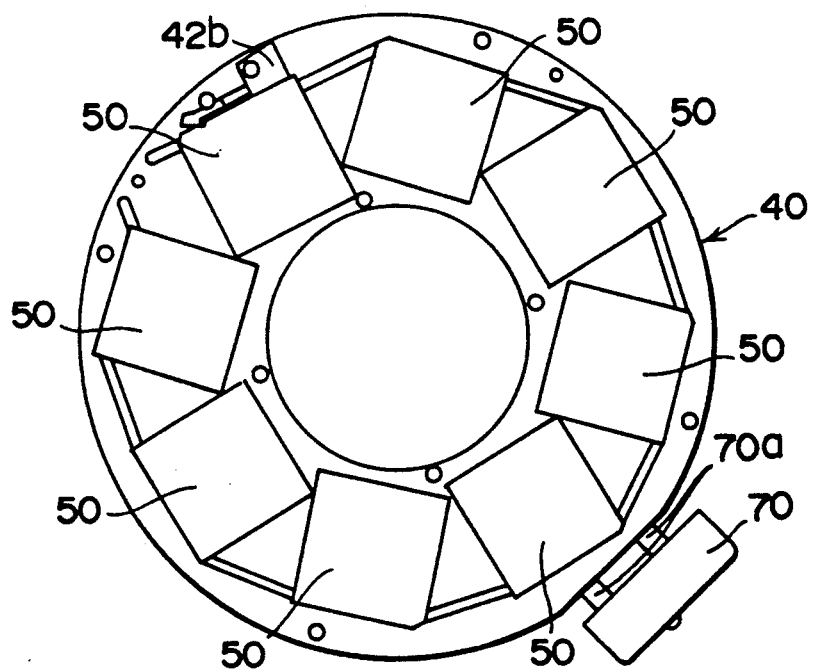
F I G. 7

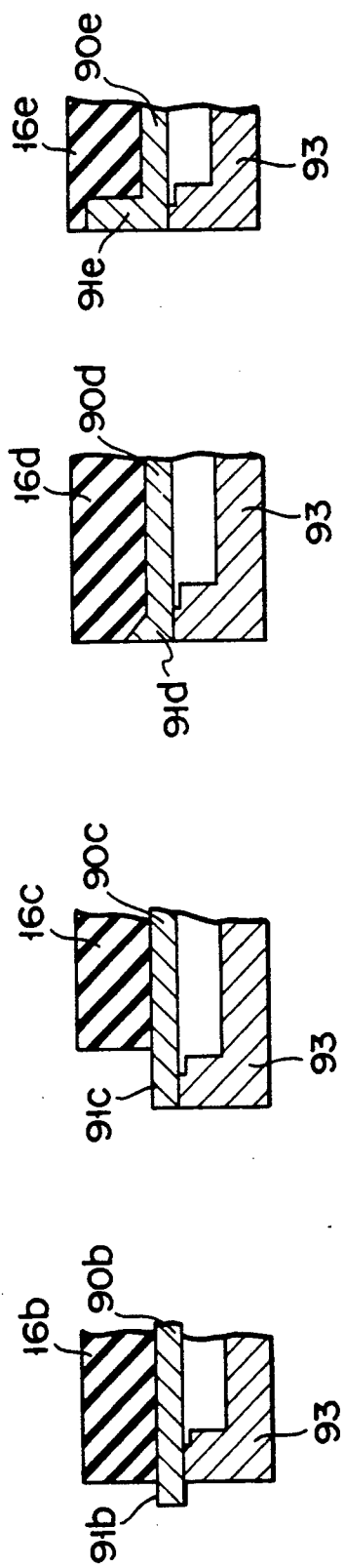

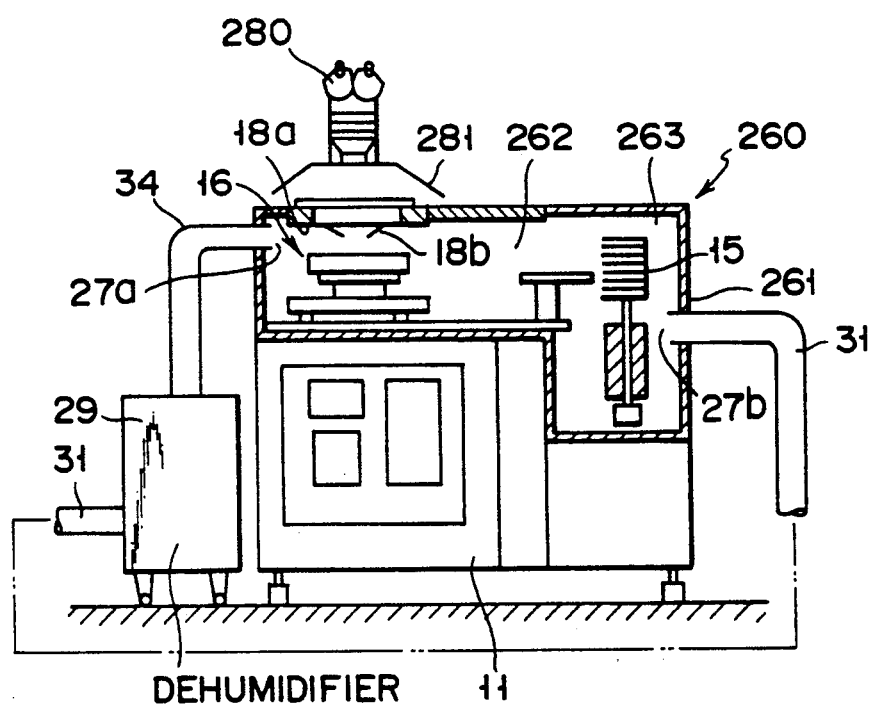
F I G. 22

ELECTRIC PROBING-TEST MACHINE HAVING A COOLING SYSTEM

CROSS-REFERENCE TO THE RELATED APPLICATIONS

This is a division of application Ser. No. 07/512,105, filed on Apr. 20, 1990, issued Jan. 28, 1992, as U.S. Pat. No. 5,084,671, which is a continuation-in-part of Ser. No. 07/298,302, filed Jan. 17, 1989, now abandoned, which is a continuation-in-part of Ser. No. 07/236,749, filed Aug. 26, 1988, now abandoned.

BACKGROUND OF THE INVENTION

1. Field of the Invention

This invention relates to an electric probing-test machine for inspecting device patterns formed on semiconductor wafers in a process of manufacturing semiconductor devices such as LSIs, or to a probing-test machine for inspecting Liquid Crystal Devices (LCD) and electronic circuits such as printed circuit boards. More specifically, the invention concerns an electric probing-test machine, which has a cooling system which can avoid formation of frost on the object while testing the object under a low temperature condition.

2. Description of the Related Art

Semiconductor devices which are operated at low temperatures, e.g., HEMTs and Josephson elements, are being developed prosperously for the purpose of computer operation speed increase. A characteristics test on each device pattern under a low temperature condition is conducted in the last stage before individual semiconductor chips are diced from the wafer because the cost of test becomes enormous if the test is conducted after the dicing process. This test is called a wafer test, which is an electric test conducted for each device pattern between a wafer formation process and an assembly process, i.e., after pre-process such as pattern etching or coating with a protective film. The wafer test is done for the purposes of rejecting defective devices in the stage before the individual semiconductor chips are cut from the wafer and also improving the yield and reliability by feeding back the test results to the preceding process.

A wafer test system employed for the test basically consists of two units, i.e., an electric probing-test machine (also called wafer prober) and a tester. The two units are connected together via a measuring line. In the system, probes are contacted to respective bonding pads of a device pattern, and test complete signals and test fall signals are exchanged between the wafer prober and tester with test start command from a test control line.

Wafer probers are disclosed in many publications such as Japanese Patent Publication Sho 59-50942, Japanese Utility Model Laid-Open Sho 61-97839 and Japanese Utility Model Laid-Open Sho 61-88240. These wafer-probing machines, however, are used under room temperature conditions and are not suited for wafer tests under low temperature conditions.

The specifications of Japanese Utility Model Laid-Open 59-35876, Japanese Patents Laid-Open 55-44931, 58-220438, 59-19343, 59-41846 and 59-57444, and Japanese Patent Application 62-60581 disclose wafer probers, in which a main chuck for holding a wafer can be cooled at the time of the test.

However, since these wafer-probing machines have openings at various parts thereof. e.g., the opening for entry of a probe card, humid air outside the machine enters the test section. Therefore, when the main chuck is cooled, the humid air present near the main chuck is cooled quickly by radiation cooling, and moisture in the air condenses and dew adheres to and is frozen on the chuck top.

When such frost is formed on the chuck top, the wafer can no longer be supported at a predetermined height level, thus making it difficult to have a large number of probes be in correct contact with also a large number of bonding pads. In addition, the wafer is frozen to the chuck top, making it difficult to remove the wafer from the chuck top. Further, if the frozen wafer is forcibly removed from the chuck top, damage to the wafer is prone.

The conventional chuck top cooling system serves to circulate a coolant such as ethylene glycol liquid, which has been cooled by the refrigerator, from the heat exchanging tank to the heat exchanging jacket by the feed pump.

When the chuck top reaches a predetermined temperature, the refrigerator is stopped by the control means (CPU). The coolant is thus warmed up by sensible heat of surrounded air in a minute. When the chuck top is also warmed up over the predetermined temperature by the warmed-up coolant circulated, the refrigerator is made operative in response to information applied from the temperature sensor, thereby keeping the chuck top at the predetermined temperature.

In the case of the conventional chuck top, however, ethylene glycol liquid circulated is cooled by the refrigerator and it is difficult to continual start up and shut down of the refrigerator. Even if it is asked that the refrigerator is started up and shut down at a certain interval, the compressor will prevent this. In short, it is difficult to frequently start and stop the compressor The motor for driving the piston of the compressor has a small initial starting force. In addition, the supply of current to the motor is automatically shut down when the piston is brought under high pressure but it is again started when high pressure is not applied to the piston. It is therefore difficult to frequently start and stop the compressor.

Because of this response delay of the compressor, temperature fluctuation (or temperature rippling phenomenon) is caused on the surface of the chuck top. This temperature fluctuation on the surface of the chuck top is usually in a range of $\pm 2 \sim 3°$ C. and the semiconductor wafer mounted on this chuck top cannot be therefore stably cooled.

Further, the chuck top is made of insulating material such as ceramics and it is therefore low in heat conductivity. This makes temperature in the central portion of the chuck top different from that at the peripheral portion thereof. It is therefore quite difficult to uniformly cool the whole of the chuck top.

In the case of the conventional cooling system, the pump is made so high in pressure as to supply a large amount of coolant to the heat exchange jacket. When the discharge pressure of pump is made high in this manner, the pressure in the pipe through which the coolant is circulated becomes higher than atmospheric pressure, thereby causing the piping to be broken or the coolant to be leaked through couplings and the like. Therefore, a large amount of coolant cannot be supplied to the heat exchange jacket. This makes it difficult to fully and accurately cool the chuck top.

In order to fully cool the chuck top, it is needed that the coolant (or non-freezing liquid) is fully circulated through the heat exchange jacket. When heat exchange is carried in the tank, the coolant is needed to circulate in the tank in such a manner that it flows adjacent to the cooling coil (or evaporator) connected to the refrigerator.

In the case of the conventional system, however, liquid resistance in the piping between the tank and the chuck top is so large that the amount of coolant circulated cannot be increased over a certain value. Therefore, a part of coolant freezes adjacent to the cooling coil and this causes that area of the coil which is contacted with the coolant circulated to be made insufficient, thereby lowering the heat exchanging rate in the tank.

In order to increase the amount of coolant circulated in the heat exchange tank, it is imagined that an agitator is added to the tank, but this will make the cooling system large in size and complicated in construction with the result of its costing high. In addition, the coolant will be exposed to heat created by a motor for the agitator and temperature control for the coolant will become complicated accordingly.

SUMMARY OF THE INVENTION

An object of the present invention is to provide cooling system, smaller in size and lower in cost, capable of more quickly and accurately cooling the chuck top and being more stably used for a longer time period.

Another object of the invention is to provide a wafer prober, which is substantially free from dew condensation and frost formation on the chuck top even when gas near the main chuck is cooled by radiational cooling.

According to an aspect of the invention, there is provided an electric probing-test machine, which comprises, probe means having a plurality of probes contacted with an object and serving to apply test signal to a tester which judges whether a circuit on the object is correct or not, chuck means for holding the object, cooling means for cooling the chuck means and control means for controlling the cooling means, wherein said chuck means includes a chuck top directly contacted with the object, a heat exchange jacket arranged to carry out heat exchange relative to the chuck top, and a means for detecting the temperature of the chuck top.

The cooling means includes a means for supplying a coolant to the heat exchange jacket. The amount of coolant supplied from a reservoir to the heat exchange jacket is controlled by the control means responsive to temperature information detected by the temperature detecting means. As a result, the temperature of the chuck top is controlled to a test temperature for testing the object.

It is preferable in this case that the coolant supply means has a first pump for supplying the coolant to the heat exchange jacket and a second pump for removing the coolant from the heat exchange jacket and that the coolant reservoir is common to the first and the second pumps and system is provided to circulate the coolant between the heat exchange jacket and the coolant reservoir.

It is preferable that the coolant supply means has a bypass between the coolant supply pump and the coolant reservoir and that a part of the coolant is returned to the coolant reservoir through the bypass without being supplied to the heat exchange jacket.

It is preferable that a metal plate is arranged just under the chuck top member to uniformly cool the chuck top member. It is desirable that the metal plate is made of such material as copper and copper alloy which are excellent in heat conductivity.

It is desirable that the chuck top member is cooled by Peltier elements to finely adjust the temperature of the object.

It is desirable that the heat exchange jacket is heated by a heater to finely adjust the temperature of the object.

It is desirable that the chuck means and the object are enclosed by an enclosing means and that dry gas is supplied inside the enclosing means. The supply of dry gas prevents dews from being formed on the object. It also prevents the object from being frozen.

The enclosing means encloses not only the chuck means but also a loader for transporting the object to the chuck means. It may further enclose the body of the machine.

Further, the enclosing means may be produced from a flexible transparent material, e.g., a soft vinyl chloride sheet.

Further, the enclosing means may be formed with an opening, and a cover may be provided such as to be able to hermetically close and open the opening. In this case, a lightshield in the form of an isolating clothlike screen is suitably used to close the opening so as to prevent external air from entering the inside.

Further, the dry air supply means is suitably a dehumidifier. In this case, the dehumidifier suitably serves both as dry air supply means and as exhaust means.

Further, the dehumidifier suitably has a pair of desiccant-filled vessels for dehumidifying and drying gas with a desiccant in one of the desiccant vessels while the desiccant in the other desiccant vessel is being regenerated by making use of part of dry air, the pair desiccant vessels being caused to effect the dehumidification drying and regeneration alternately.

Further, preferably part of dry air supplied into the chuck section should be exhausted to the outside of the machine and the remainder of the dry air should be sent to the dehumidifier to be dried again.

As the dry air, air is usually used, but it is possible to use as well an insert gas, e.g., nitrogen gas or argon gas.

Further, in case where the test temperature is below $-10°$ C., the absolute humidity of dry air at the room temperature of $20°$ C. is suitably below $2.25$ g/m$^2$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a schematic view showing a first embodiment of the heat exchange element control system and the coolant circulation system (cooling system) for a chuck top;

FIG. 4 is a perspective view showing the chuck top along with a semiconductor wafer and a probe card;

FIG. 5 is a vertically-sectioned view showing most of a main chuck;

FIG. 6 is a horizontally-sectioned view showing those passages in the heat exchange jacket through which the coolant passes;

FIG. 7 is a plan showing Peltier elements and a temperature sensor attached to the top of the heat exchange jacket;

FIGS. 8 through 11 are vertically-sectioned views showing main chucks partly which are variations of the first embodiment;

FIG. 22 is a sectional view, partly broken away, showing a second embodiment of the electric probing-test machine according to the invention;

DETAILED DESCRIPTION OF THE PREFERRED EMBODIMENTS

Now, various embodiments of the invention will be described with reference to the drawings.

Figure 1:
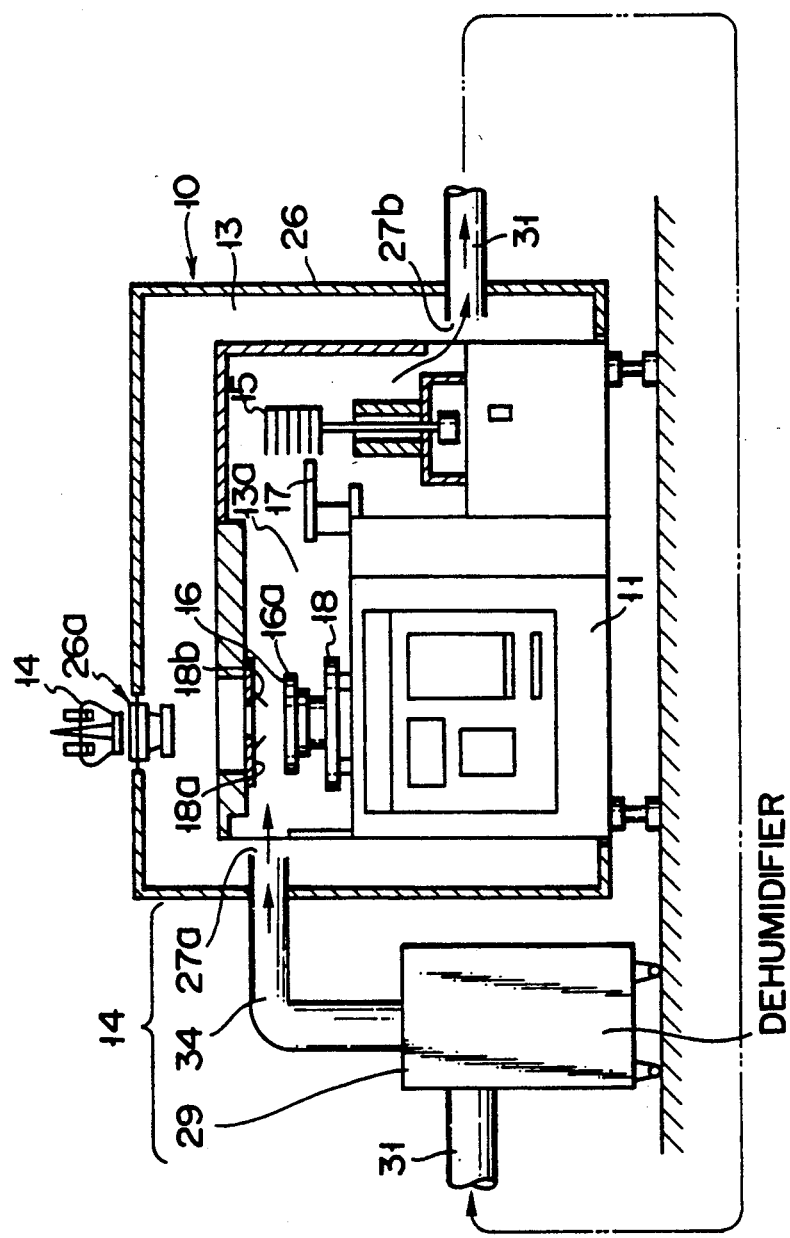
FIG. 1 is a schematic sectional view, partly broken away, showing a first embodiment of the electric probing-test machine having a cooling system according to the invention.

As shown in FIG. 1, a fully automatic electric probing-test machine (or wafer prober) 10 for testing semiconductor wafers is installed via a vibration-proof member on the floor. The machine 10 mainly comprises a body 11, a loader 17 for taking out a semiconductor wafer from one or more wafer cassettes 15 and transporting the taken-out semiconductor wafer, main chuck 16 for holding the transported semiconductor wafer set thereon, an alignment mechanism 18 for displacing the main chuck 16 in X-, Y-, Z- and O-directions for alignment and probe card 18a facing a chuck top 16a of the main chuck 16 and having a number of probes 18b. Each probe 18b is connected through a measuring line (not shown) to a tester (not shown). When carrying out a wafer test using the machine 10, probes 18b are electrically connected to bonding pads (electrodes) of each chip (device pattern) formed in a wafer, and test signals are supplied from the tester to the chip, and response signals are supplied from the chip to the tester, thereby determining the electric characteristics of the chip.

The machine 10 is entirely enclosed by a cover 26. The cover 26 is box-like and manufactured from transparent members such as plastic sheets of a transparent acrile resin or the like. It has a removable structure and can be fitted on and removed from the machine 10 downwardly and upwardly. It is secured to the body 11 via a plurality of spacers (not shown) provided at suitable positions. A space 13 is defined between the cover 26 and the top and sides of the machine 10. The cover 26 has an opening 26a formed in its top wall. A microscope 14 for manual inspection can be introduced through the opening 26a into the inside of the cover 26. The microscope 14 is adapted to be hermetically sealed with the cover 26 at the opening 26a to prevent external air from entering the test space.

A dehumidifier 29 is disposed outside the machine 10. The dehumidifier 29 is provided with air supply and exhaust ductlines 34 and 31 having respective air supply and exhaust ports 27a and 27b introduced into the space 13 through openings formed in the cover 26.

Figure 14:
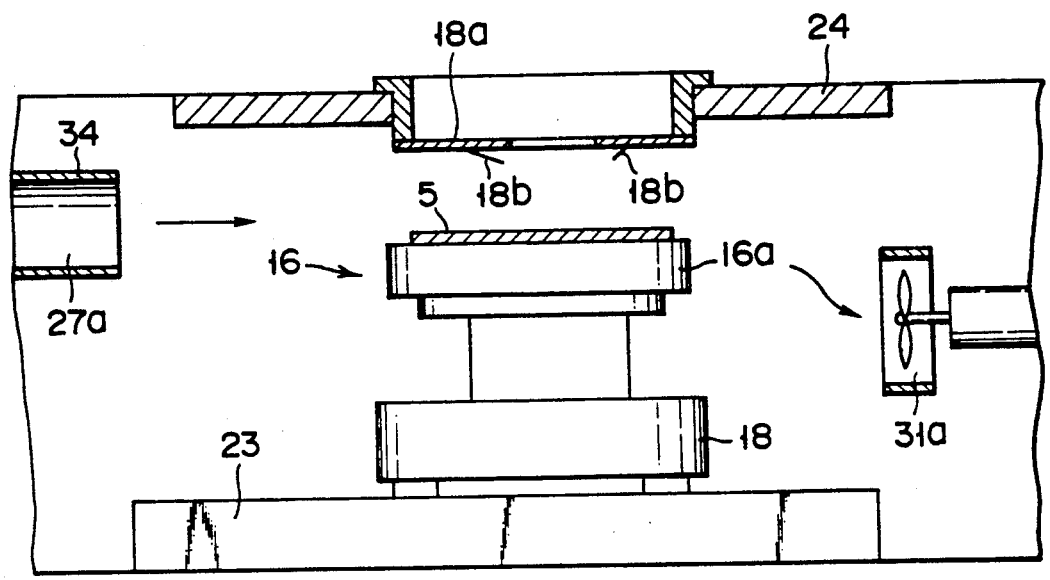
FIG. 14 is a sectional view showing a modification of the embodiment of FIG. 1 with a fan provided in a test space.

FIG. 14 shows a modification of the embodiment of FIG. 1. In this instance, a fan 31a is provided near the main chuck 16 for drawing air from one side of the chuck 16, and also for causing forced flow of dry air supplied from the air supply port 27a to the fan 31a.

Now, the dehumidifier 29 will be described in detail with reference to FIG. 2.

The dehumidifier 29 has a pair of cylindrical desiccant vessels 30a and 30b filled with a desiccant. The desiccant may be synthetic zeolite or silica. Moisture-containing air withdrawn through the ductline 31 is led through a first shuttle valve 32 and a ductline line 35a to enter the first desiccant vessel 30a. Dry air in the first desiccant vessel 30a is led through ductlines 37a and 38a, a second shuttle valve 33 and the ductline 34 to enter the space 13. The dry air is partly led through an orifice 39b and a ductline 37b to enter the second desiccant vessel 30b for regenerative drying of the desiccant in the vessel 30b. Air that has been used for the regenerative drying is led through a ductline 35b and a safety valve (SV1) 36 to be discharged into atmosphere. The first shuttle valve 32 and the second shuttle valve 33 can be switched over to each other by a timing motor provided in a control box (not shown). When the two shuttle valves 32, 33 are switched, the sense of air flow is inverted to interchange the air drying and regenerative drying of the first 30a and the second desiccant vessel 30b.

A heat exchange control system for the chuck top 16a, on which a wafer is set, will now be described with reference to FIG. 3.

The system comprises a test section 2 and a coolant supply section 3. The main chuck 16 mainly includes the chuck top 16a and a copper-made heat exchanging jacket 40. The chuck top 16a is connected via a heat exchanging element 50 to the jacket 40. The main chuck 16 has temperature sensor 42b connected to an input unit of first controller 41b and temperature sensor 42a connected to an input unit of second controller 41c. Outputs of the second controller 41c are connected to Peltier elements 50. Outputs of the first controller 41b are connected to first and second pumps 45a and 45b. A sucking port of the first pump 45a is communicated with the inside of a coolant tank 43 through a piping 46a while a discharging port thereof is communicated with a passage 40a in the heat exchange jacket 40 through a piping 46b.

A sucking port of the second pump 45b is communicated with the passage 40a in the heat exchange jacket 40 through a piping 47a, while a discharge port thereof with the coolant tank 43 through a piping 47b. The pipings 46b and 47a are flexible pipes which can follow the main chuck 16 movable in the directions X, Y, Z and O. These flexible pipes 46b and 47a are detachably connected to rigid pipes of the pumps 45a and 45b through flanges 46c and 47c. When the flanges (or couplings) 46c and 47c are disconnected together with electric wiring connectors (not shown), the cooling section 3 can be separated from the test section 2.

A coolant (or non-freezing liquid) 44 in the tank 43 is re-circulated by the first and second pumps 45a and 45b, passing through the piping 46b, flow path 40a and piping 47a and then back to the tank 43.

As shown in FIG. 6, instead of providing the labyrinth flow path 40a, it is possible to partition the inside of the heat exchanging jacket 40 into a number of spaces with frames 40b, 40c and a number of ribs 40d, 40e, 40f made of aluminum plate or the like, as shown in FIG. 6. By the use of the rib-partitioned structure, the meandering or lattice-patterned flow paths 40a are formed in the heat exchanging jacket 40. Thus, the coolant can be circulated at rapid flow rate and the heat exchange efficiency can thereby be improved. The adoption of a metal with high heat conductivity, e.g., aluminum or copper for the ribs will improve the heat exchange efficiency of the heat exchange jacket 40.

An aqueous solution of ethylene glycol may be used as the coolant 44. In addition, a cooling system using liquefied nitrogen or freon (trade name) may be adopted. Preferably, a dual cooling system using a combination of freon and a non-freezing liquid should be adopted. A heating section 48a of a heater 48 and a cooling section 49a of a refrigerator 49 are immersed in the coolant 44 in the tank 43 for heating and cooling the coolant 44, respectively. In this case, a thermistor is suitably used as the temperature sensor 42 for controlling the temperature of the coolant 44. The first controller 41b thus compares the thermistor output temperature to a preset temperature and controls the currents through the heater 48 and refrigerator 49 to make difference between the two temperature values zero. With the heat exchange control system as described above, it is possible to suitably control the temperature of the top surface of the chuck top 16a at a desirable level in the temperature range from $-55°$ C. to $+150°$ C.

A probe card 18a, as shown in FIG. 4, is disposed such that it can face the wafer 5 set on the chuck top 16a. It has probes 18b corresponding in number to the number of pads of each chip (device pattern) 5a. The probes 18b are connected an external tester (not shown) for supplying signals to the tester.

The structural arrangement of the main chuck 16 will be described referring to FIGS. 5 through 11.

The chuck top 16a is provided with a top portion of the main chuck 16. A plurality of grooves 81 are formed in the chuck top 16a to attract the wafer 5 thereon. These grooves 81 are made open at the top surface of the chuck top 16a and communicated with one another in the chuck top 16a. They are also communicated with the sucking port of the vacuum pump (not shown) through passages 80.

A thermocouple 42a is embedded in the chuck top 16a to detect temperature at a certain position of the chuck top 16a. This thermocouple 42a is connected to the input unit of the second controller 41c.

A copper plate 90 is closely attached to the underside of the chuck top 16a. This copper plate 90 has a diameter of 140 mm and a thickness of 7 mm, for example.

The heat exchange jacket 40, Peltier elements 50 and a heater 94 are housed in a recess of a ring cup 93. Plural bolts 96 are arranged on the underside of the ring cup 93 and when these bolts 96 are fastened, a cover 95 is forced against the ring cup 93 so that they can be fixed to each other. The copper plate 90, ring cup 93 and chuck top 16a are fixed to one another by means of a screw 51.

As shown in FIG. 7, eight Peltier elements 50 are bonded to the top of the heat exchange jacket 40. The topface of each of these elements 50 is closely attached to the underface of the copper plate 90. The resistance thermometer 42b is bonded to the topface of the heat exchange jacket 40 and connected to the input unit of the first controller 41b.

The heater 94 is closely contacted with the under face of the heat exchange jacket 40. An output unit of the first controller 41b is connected to a power supply for the heater 94.

A socket 70 is attached to an outer wall 40b of the heat exchange jacket 40 and a pair of passages 70a extending from the socket 70 are communicated with internal passages 40a in the jacket 40.

A pin 57 is accommodated in a hole 56 such that it can project upwardly from the top surface of the chuck top 16a. The role of the pin 57 is to kick up the wafer 5 away from the top surface of the chuck top 16a after completion of a test.

The outer circumference of the main chuck 16 is covered by an insulation 97.

As shown in FIGS. 8 to 11, it is possible to replace the peripheral portion of copper plate 90 with each of a peripheral portion 91b to 91e of a plate 90b to 90e. As shown in FIGS. 8 and 9, when diameters of the copper plates 90b and 90c are made larger than those of chuck tops 16b and 16c and the peripheral portions 91b and 91c are projected outside from rims of the chuck tops 16b and 16c, the surface temperature of each of the chuck tops 16b and 16c can be made more uniform.

As shown in FIGS. 10 and 11, when peripheral portions 91d and 91e of the copper plates 90d and 90e are made thicker than the other portions thereof, peripheral portions of the chuck tops 16d and 16e can be more highly cooled to make the surface temperature of each of the chuck tops 16d and 16e more uniform.

Now, the description will be made in connection with a case where a semiconductor wafer is tested under a low temperature condition using the first embodiment of the electric probing-test machine with reference to FIGS. 1 through 14.

The power supply for the wafer prober 10 is switched on. Keys on a keyboard (not shown) at the operation panel of the wafer prober 10 are pushed to previously set a temperature at which the wafer 5 is tested or to test the wafer 5 at a temperature of −10° C., for example.

This set temperature or target temperature of −10° C. and data detected by the temperature sensor are input into the CPU 41a according to the program previously stored therein. The CPU 41a calculates an amount of the coolant allowed to flow into the heat exchange jacket 40 or an amount of 200 ml/min, for example, from the data input according to the program previously stored in the CPU 41a.

A motor (not shown) is made operative to rotate the first pump 45a in such a way that this amount of the coolant can be sent into the heat exchange jacket 40. The temperature of the jacket 40 is fed back to the CPU 41a after the amount of the coolant is sent to the jacket 40. An amount of the coolant supplied is calculated from the fed-back data of the top surface temperature of the jacket 40 according to the PID control system. The first pump 45a is rotated so as to supply the calculated amount of the coolant into the jacket 40.

On the other hand, the second pump 45b is made operative to forcedly discharge the coolant in the jacket 40.

When the motors for the first and second pumps 45a and 45b are intermittently switched on and off as described above, the coolant 44 which has been cooled to the certain temperature can be supplied to the jacket 40 and chuck top 16a, while changing the amount of the coolant supplied to 300 cc, 200 cc or 100 cc, for example, thereby enabling the chuck top 16a to be kept at the target temperature.

Air in the spaces 13 and 13a is withdrawn into the dehumidifier 29 to be dried by removal of moisture content. The dry air thus obtained is supplied back to the spaces 13 and 13a to be blown directly against the chuck top 16a. It is supplied continuously at a rate of 100 milliliters per second, for instance, to sufficiently fill the spaces 13 and 13a with dry air. Air supplied to the space 13a is made dry such that its absolute humidity is below 2.23 g/m$^3$. After the test space 13a is made dry, the chuck top 16a is cooled to −10° C.

Figure 12:
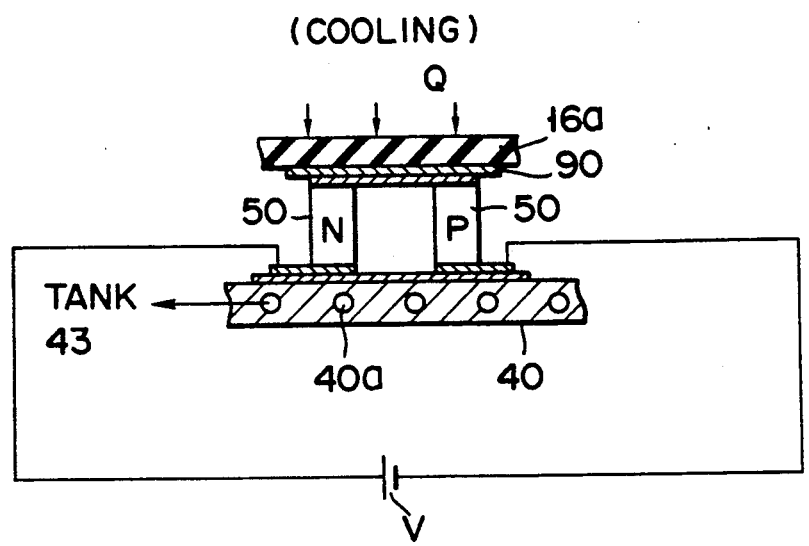
FIG. 12 is a view for explaining the cooling of the chuck top.

When cooling the chuck top 16a, elements 50 are energized with its negative (N) and positive (P) sides made to be positive (P) and negative (N), respectively as shown in FIG. 12, so that heat is generated on the side of the jacket 40 and absorbed on the side of the chuck top 16a by the Peltier effect. At this time, the liquid 44 is cooled by operating freezer 49 to be supplied to the flow path 40a of the jacket 40 for cooling the heat-generating section of the elements 50. Through the flow path 40a of the jacket 40 is circulated the coolant at a temperature slightly lower than a preset temperature of the chuck top 16a.

Figure 13:
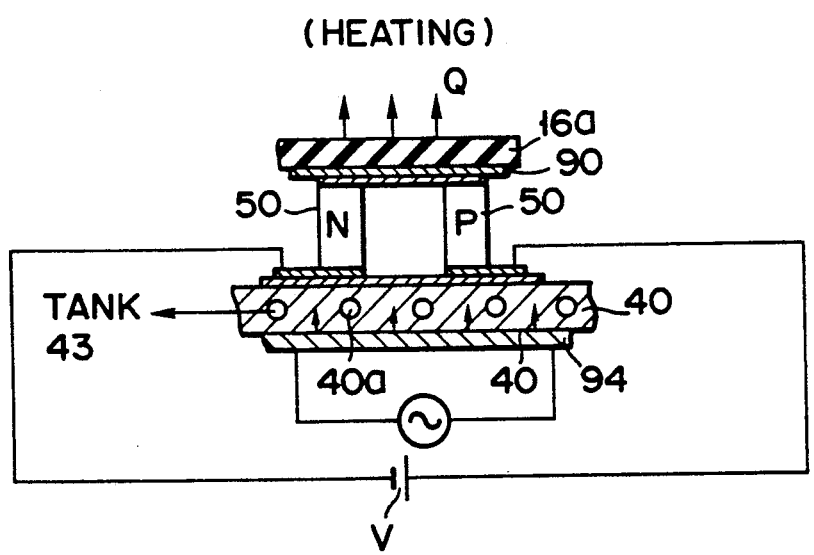
FIG. 13 is a view for explaining the heating of the chuck top.

Then, the chuck top 16a which has been slightly overcooled is heated for fine temperature control. Then, the elements 50 are energized with its negative (N) and positive (P) sides made to be negative and positive, respectively, as shown in FIG. 13, so that heat is generated on the side of the jacket 40 and absorbed on the side of the chuck top 16a by the Peltier effect. The heat exchange jacket 40 is further heated by the heater 94. At this time, the liquid 44 is heated by operating the heater 48 to be supplied to the flow path 40a of the jacket 40 by heating the heat-absorbing section of the elements 50.

In the above way, the temperature is controlled such that the top surface of the chuck top 16a is accurately at −10° C.

Table 1 shows the saturation steam content (at relative humidity of 100%) at various temperatures. Assuming a room temperature of 20° C. and a test temperature of −10° C., if the absolute humidity of the supplied air is below 2.24 g/m$^3$ (saturated humidity at −10° C.), no frost is formed on the chuck top 16a even at a temperature of −10° C., as is obvious from Table 1. Thus, if dry air with an absolute humidity less than 2.25 g/m$^3$ is blown against the chuck top 16a in the spaces 13 and 13a at all time, no frost is formed on the chuck top 16a even at a temperature of −10° C. By way of reference, the maximum value of the absolute humidity $\theta$ of dry air, with which no frost is formed on the chuck top 16a at the test temperature of −10° C. is $$\theta = (2.25 + 17.3) \times 100(\%) = 13(\%)$$

TABLE 1

| Test temperature (°C.) | Serial No. | | | | |
|---|---|---|---|---|---|
| | 0 | 1 | 2 | 3 | 4 |
| 90 | 420.1 | 433.6 | 448.5 | 454.3 | 480.8 |
| 80 | 290.8 | 301.7 | 313.3 | 325.3 | 337.2 |
| 70 | 197.0 | 2.4.9 | 213.4 | 222.1 | 231.1 |
| 60 | 129.8 | 135.6 | 141.5 | 147.6 | 153.8 |
| 50 | 82.9 | 86.9 | 90.9 | 95.2 | 99.6 |
| 40 | 51.0 | 53.6 | 56.4 | 59.2 | 62.2 |
| 30 | 30.3 | 32.0 | 33.8 | 35.6 | 37.5 |
| 20 | 17.3 | 18.3 | 19.4 | 20.6 | 21.8 |
| 10 | 9.40 | 5.19 | 5.56 | 5.95 | 6.35 |
| −0 | 4.85 | 5.19 | 5.56 | 5.95 | 6.35 |
| −10 | 2.25 | 2.18 | 2.02 | 1.87 | 1.73 |

The effect of prevention of frost formation on the chuck top 16a is promoted by providing fan 31a facing dry air supply port 27a, as shown in FIG. 14 and forcibly exhausting air in the neighborhood of the chuck using fan 31a.

When sufficiently dry atmosphere is attained in the test space 13a, the power source switch for the prober 10 is turned on, and a program card is inserted into an input section of the body 11. As a result, one wafer 5 is taken out from the cassette 15 by the actuator of the fully automatic wafer transporter and is vacuum-attracted by a vacuum attraction mechanism of the chuck top 16a. When the wafer 5 is set on the chuck top 16a, it is adjusted by the auto-alignment mechanism 18. Then an XYZ-stage is operated for positioning of the wafer 5 in X-, Y- and Z-directions. Subsequently, the individual probes 18b of the probe card 18a are brought into contact with the corresponding pads 5b of the chip 5.

Prior to the probe-pad contacting, each probe 18b and each pad 5b are positioned with respect to each other on the first wafer which is to be tested. This probe-pad contacting is performed by moving the main chuck 16, while the contact of each probe 18b and each pad 5b are being as certained under a microscope or the like in such a manner that all chips formed on the wafer can be inspected. The data representing the positions of the probes 18b and pads 5b is stored into a memory.

The probe-pad contacting is automatically carried out in accordance with the data stored in the memory. After the probes 18b have contacted the pads of the chip 5a, the test-start signal is supplied from the prober to the tester. Then, the measuring program of the tester is executed. As a result, test signals are supplied from the tester to the device via the measuring lines connected to the probe card 18a, whereby the device is tested. After the wafer alignment has been completed, a short distance test is carried out by generation of a high frequency from a test head (not shown). When one pattern test is completed, a test completion signal is supplied from the tester (not shown) to the prober 10. According to this signal, the XYZ stage is operated for setting the probes with respect to the next pattern. If a defective pattern is detected as a result of test, a fail signal is supplied from the tester to the prober 10. According to this signal, the defective pattern is marked by an inker (not shown). The operations described above are performed entirely automatically at the time of the maintenance and inspection of the machine or at the time of positioning the probes with respect to the first wafer, replacement of the probe card 18a.

The above embodiment has concerned with a case of dehumidifying and drying air while air is circulated between the dehumidifier 29 and the test space 13a. However, this is by no means limitative; for instance it is to provide dry air supply means and air exhaust means separately to replace high humidity air in the test space with dry air.

In the first embodiment described above, the body 11 of the prober can be enclosed entirely by the cover 26, so that it is possible to trap all dust from the body 11 in the dehumidifier 29 and maintain the clean room inside highly clean.

Figure 15:
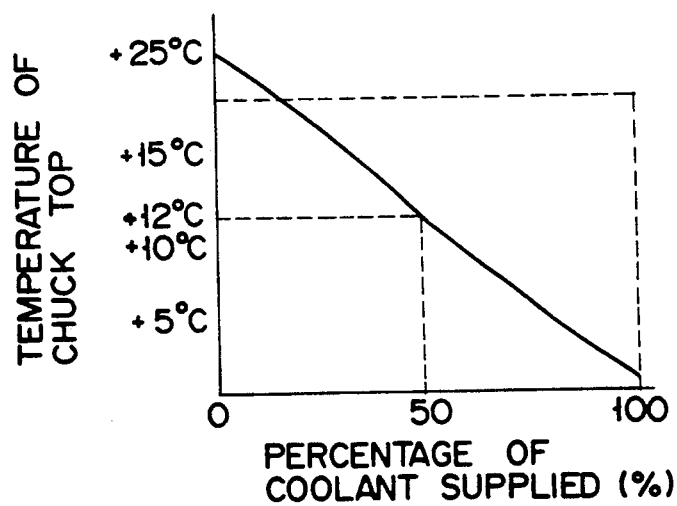
FIG. 15 is a graph showing the relation between the percentage of coolant supplied to the heat exchange jacket and the temperature of the chuck top.

FIG. 15 is a graph in which percentages of the supplied coolant are plotted on the horizontal axis while plotting temperatures of the chuck top on the vertical axis.

Figure 16:
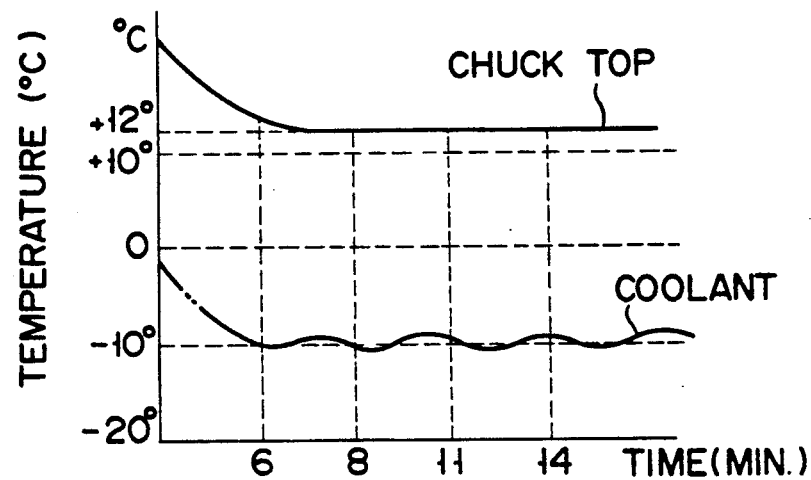
FIG. 16 is a graph showing how the temperature of the first embodiment of the chuck top changes.

FIG. 16 is a graph showing how temperatures of the chuck top and coolant change as time goes by when times or minutes are plotted on the horizontal axis of the graph while plotting temperatures on the vertical axis thereof.

Figure 17:
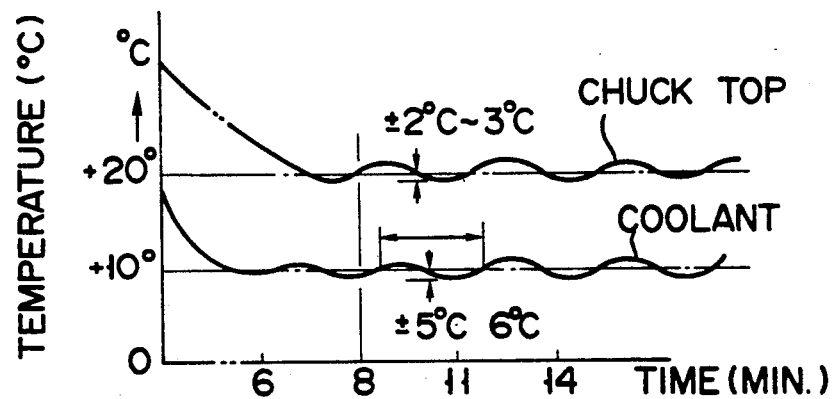
FIG. 17 is a graph showing how the temperature of the conventional chuck top changes.

FIG. 17 is a graph showing results obtained from the conventional chuck top or showing how temperatures of the conventional chuck top and coolant change as time goes by when times or minutes are plotted on the horizontal axis of the graph while plotting temperatures on the vertical axis thereof.

As apparent from FIGS. 16 and 17, the temperature of the chuck top can be made more stable in the case of the machine according to the present invention. The chuck top of the conventional machine is influenced by the changing temperature of the coolant so that its temperature can be changed in a range of ±2~3° C. In the case of the machine of the present invention, however, the flow of heat energy can be distributed by the copper plate 90 to more uniformly cool the chuck top. No temperature difference is thus caused at any point or part of the chuck top 16a.

Figure 20:
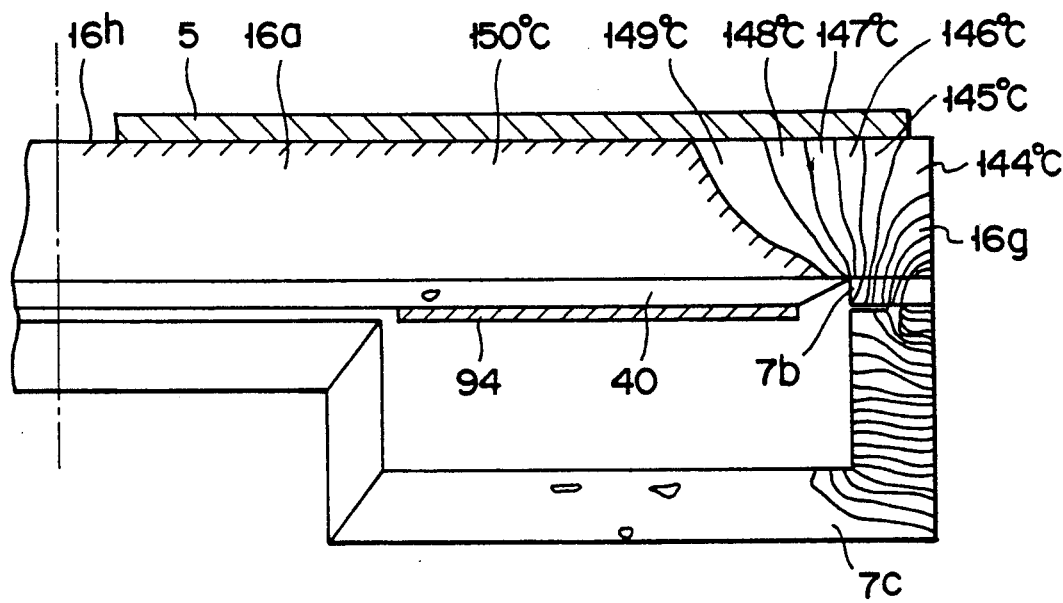
FIG. 20 shows the main chuck partly cut away to explain how temperature is distributed in the conventional chuck top.

Inventors of the present invention has recognized that temperature in the central portion of the chuck top made of ceramics is different from that at the peripheral portion thereof, and they have pursued the cause. As a result, a mica ring 7b was arranged along the peripheral portion of the chuck top 16a and fixed to a mica disk 7c, which had a diameter similar to that of the chuck top 16a, by means of screws as shown in FIG. 20.

Figure 21:
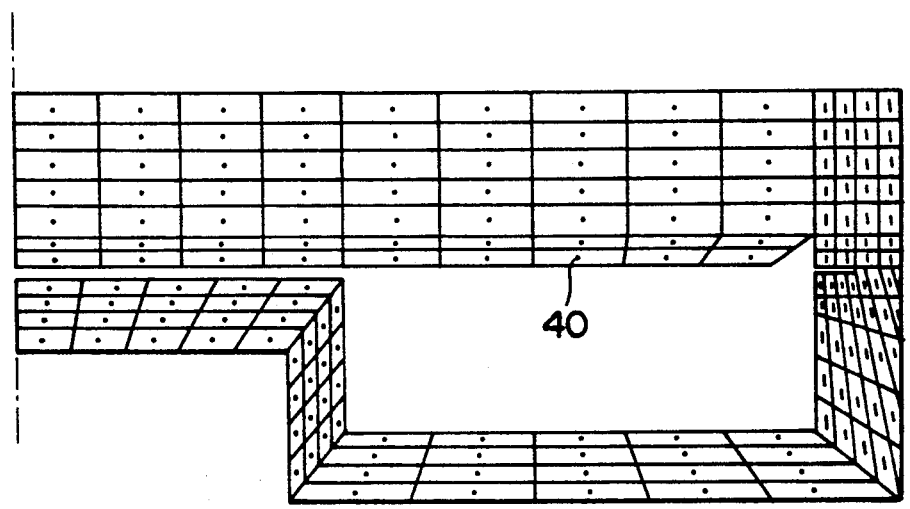
FIG. 21 is a view for analyzing heat conductivity according to the two-dimensional finite element law so as to explain how heat energy flows in the main chuck shown in FIG. 20.

When temperature was measured at the top surface the chuck top 16a, it changed from 144° C. to 150° C. as it came from the peripheral portion of the chuck top 16a to the center portion thereof. As shown in FIG. 21, in order to examine the cause of this temperature distribution, heat conductivity was analyzed according to the two-dimensional finite element heat transfer analysis. As a result, it has been found that heat vector becomes larger as it comes nearer to the outer circumference 16g of the chuck top 16a and that it becomes larger particularly at those portions of the mica ring 7b and mica disk 7c.

Figure 18:
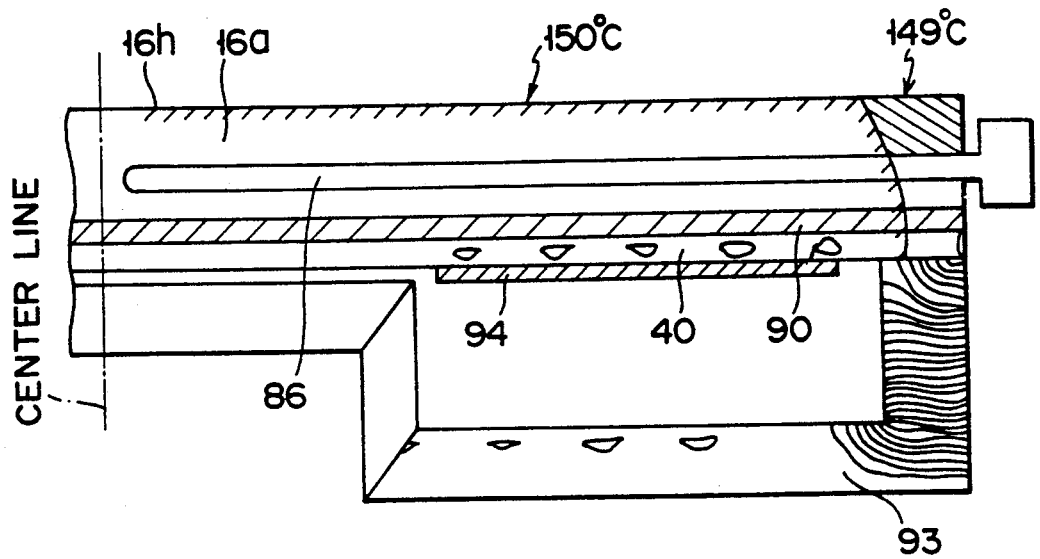
FIG. 18 shows the main chuck partly cut away to explain how temperature is distributed in the chuck top of the first embodiment.

As shown in FIG. 18, therefore, the copper plate 90 was arranged between the chuck top 16a and the jacket 40 to make temperature uniform on the top surface 16h of the chuck top 16a. Temperature distribution on the top surface 16h of the chuck top 16a was measured using a temperature sensor 86 embedded in the chuck top 16a at a depth of 5 mm from the top surface 16h thereof and assuming that simulation temperature is 150° C.

As a result, the temperature measured in the central portion of the top surface 16h was 150° C. and peripheral portion thereof was 149° C.

Figure 19:
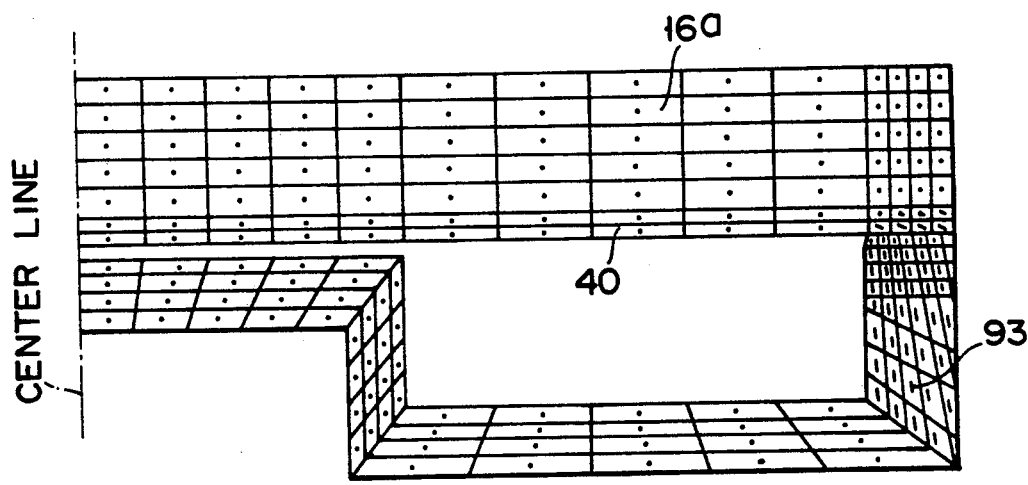
FIG. 19 is a view for analyzing heat conductivity according to the two-dimensional finite element law so as to explain how heat energy flows in the main chuck shown in FIG. 18.

As shown in FIG. 19, the flow of heat energy in the chuck top 16a shown in FIG. 18 was analyzed according to the two-dimensional finite element heat transfer analysis. As a result, the amount of heat vector in the central portion of the chuck top 16a was not different from that at the peripheral portion thereof.

FIG. 22 is a view showing a second embodiment of the electric probing-test machine. Portion of the second embodiment like the preceding first embodiment will not be described.

In this second embodiment of the machine 260, the body 11 is not covered and only test and loading sections 262 and 263 on the machine top are covered by a transparent cover 261. Further, a lightshield 281 is provided to close an opening of the cover 261. It serves to prevent external air from entering the inside through the opening when a microscope 280 for manual inspection is used.

With the second embodiment the dry air supply space is reduced, so that it is possible to reduce the rate of supply of dry air and dehumidifying time. Thus, the cost of cleaning can be reduced, that is, a highly economical wafer prober can be provided.

Figure 23:
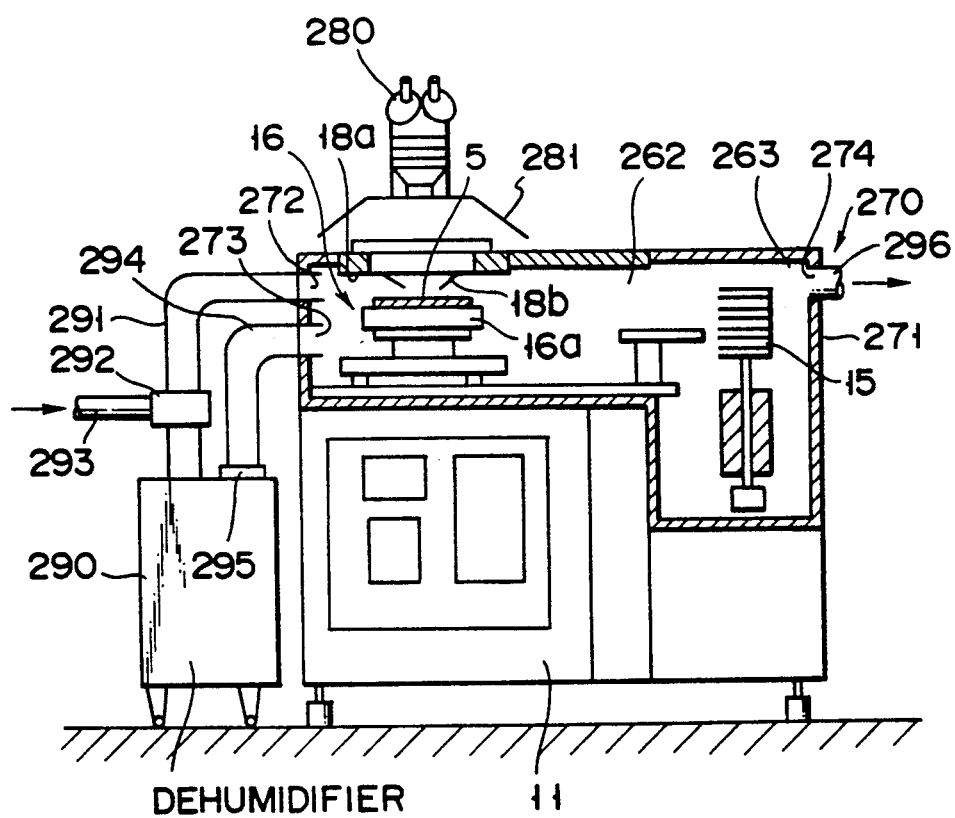
FIG. 23 is a longitudinal sectional view, partly broken away, schematically showing the wafer-probing machine according to a third embodiment of this invention.

With reference to FIG. 23, a third embodiment of the invention will now be described. Those parts of the third embodiment which are identical with those in the first and second embodiments will not be described.

In a wafer-probing machine 270 according to the third embodiment, a transparent cover 271 has formed therein three openings 272, 273 and 274 for air suction and discharge. The first and second openings 272 and 273 are located near the chuck top 16a of a test section 262. The first opening 272 communicates with a supply duct 291 of a dehumidifier 290 and the second opening 273 communicates with a return duct 294 of the dehumidifier 290.

The third opening 274 is located at an upper location of the wafer cassette 15 of a loading section 263. The third opening 274 communicates through an exhaust duct 296 with an exhaust blower (not shown) and part of dry air is discharged through the opening 274 to the outside of the machine 270.

A three-way valve 292 is connected in the supply duct 291 of the dehumidifier 290. The horizontal path of the three-way valve 292 communicates with a suction duct 29 and draws in the atmospheric air through an air filter (not shown) into the system. An air filter 295 is installed at the connection between the return duct 294 and the dehumidifier 290.

Figure 2:
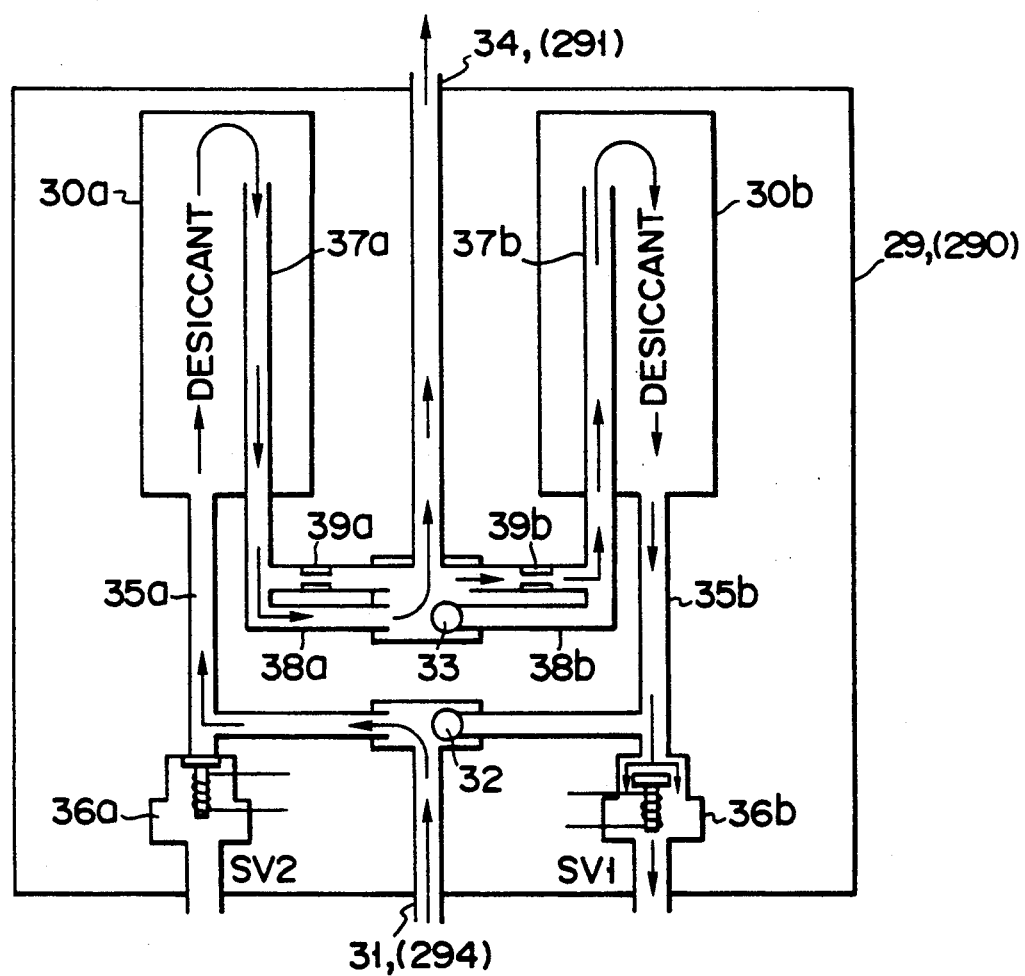
FIG. 2 is a schematic view showing the internal structure of a dehumidifier for explaining the flow of air in the dehumidifier.

As shown in FIG. 2, the return duct 294 communicates with the first shuttle valve 32 of the dehumidifier 290. The supply duct 291, on the other hand, communicates with the second shuttle valve 33 in the dehumidifier 290.

Description will now be made of a case in which the above-described wafer-probing machine according to the third embodiment to test semiconductor wafers 5 at low temperature condition of −55° C.

The semiconductor wafer 5 is picked out from the cassette 15 and, after pre-aligned, loaded on the main chuck 16. The chuck top 16a is cooled gradually by the heat exchange control system and the air in the cover 271 is dehumidified by putting the dehumidifier 290 and the exhaust blower (not shown) into operation. The dry air, supplied through the first opening 272, is made to blow directly against the semiconductor wafer 5 on the chuck top 16a at all times while the chuck top 16a is cooled.

The greater part of the dry air, supplied through the first opening 272 into the cover 271, is returned through the second opening 273 to the dehumidifier 290, but part of the dry air is discharged through the third opening 274 to the outside of the cover 271. In this case, the supply rate of dry air through the first opening 272 is set at 500 to 1500 l/min, for example.

The air returning to the dehumidifier 290 is dehumidified by a mixture of active silica gel and synthetic zeolite in the first desiccant vessel 30a. Then, the air is mixed by the three-way valve 292 with air newly drawn in and fed again through the first opening 272 into the cover 271. In this case, the air returned to the dehumidifier 290 is supplied at about 4/5 of the supply rate of dry air, namely, 400 to 1200 l/min. Therefore, exhaust air forced out into the atmosphere is discharged at about 1/5 of the supply rate of dry air, namely, 100 to 300 l/min. Hence, newly-supplied air is fed through the three-way valve 292 into the cover 271 at a flow rate of 100 to 300 l/min. When the chuck top 16a reaches −55° C., the probes 18b are made to contact the bonding pads of a chip of the semiconductor wafer 5 and a test is started.

A cooling device to cool the dry air to a temperature lower than room temperature may be added to the dehumidifier 290 mentioned above. By this means, the temperature of the chuck top and the semiconductor wafer is prevented from rising when they are exposed to dry air blowing thereto.

Further, an ionizer may be connected to the dehumidifier 290 to mix ionized oxygen gas in the dry air. Ionized oxygen gas eliminates the static electricity on the chuck top 16a and the semiconductor wafer 5.

It is possible to provide the first opening 272 described above with a diffusion plate to diffuse dry air, e.g., a plate having a multitude of small holes to cause the dry air to blow through the small holes against the chuck top 16a.

According to the third embodiment of the invention, dry air is kept blowing against the chuck all times during cooling and humid external air can be prevented from entering through a narrow gap present at the opening for entry of the probe card 18a. Particularly in the space of the test section 262, there arises an air exhausting effect, that is, the tendency for dry air to move from the inside to the outside of the cover 271 and as a result, external air is prevented from entering. Therefore, dew does not form on the chuck top 16a and semiconductor wafer 5, thus precluding chances of accidents, such as damage to the semiconductor wafers by freezing and improving the yield of the semiconductor wafers.

Further, since third opening 274 for air exhaust is provided near the wafer cassette 15, the wafers 5 in the cassette 15 are dried and dry wafers 5 can be submitted for testing.

As has been described in the foregoing, with the wafer prober having a dehumidifying function according to the invention, no air near the chuck top is condensed by radiational cooling, and frost formation on the chuck top can be effectively prevented. In addition, the wafer on the chuck can be accurately positioned with respect to the probe card. Further, since the wafer is never frozen to the chuck top, the wafer is never damaged when it is removed after the test. Thus, it is possible to improve the yield of wafers with high additional value device patterns, thus permitting cost reduction.

Further, air in the test space can be dehumidified without pressure reduction but under the atmospheric pressure, so that it is possible to effect test preparations and wafer removal in a reduced period of time compared to the prior art wafer prober. Further, since the probes are never adversely affected by the difference between the pressures inside and outside the probe card, the probes can be accurately and speedily brought into contact with the chip pads and the test program can be speedily executed.

Further, while part of dry air in the chuck section is discharged by the exhaust means, the remainder of dry air is dried again by the re-drying means and supplied to the chuck section. Hence, there arises an air-exhausting effect, that is, the tendency for dry air to move from the inside to the outside of the chuck section, thus preventing humid external air from entering the chuck section.

Figure 24:
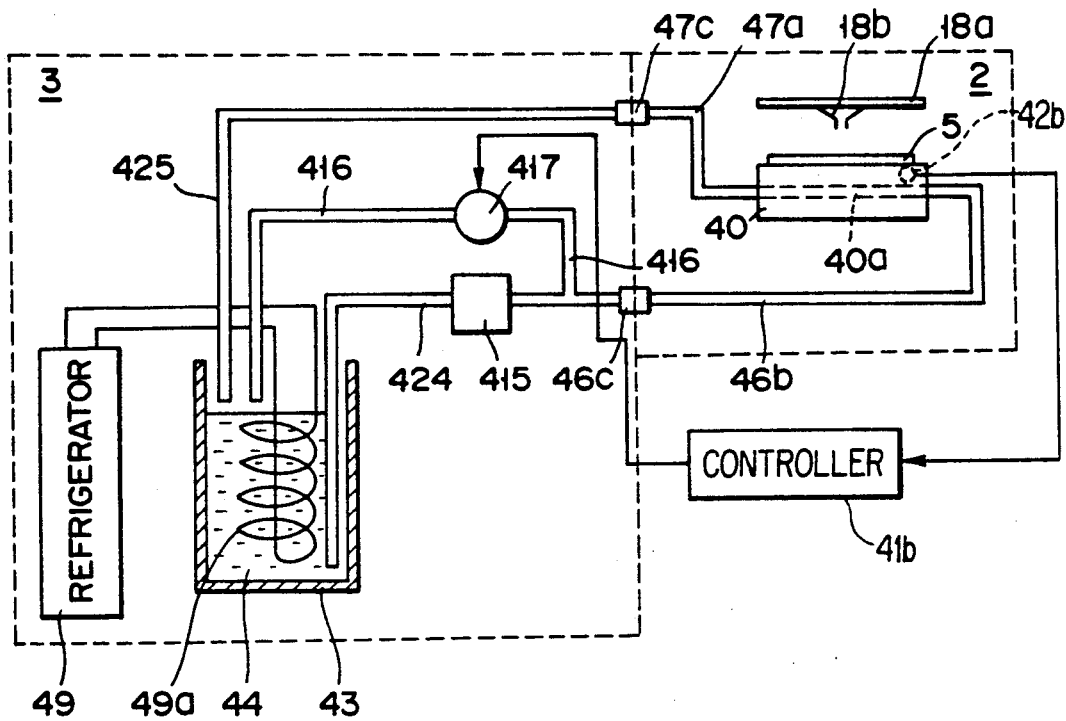
FIG. 24 is a schematic view showing a third embodiment of the heat exchange element control system and the coolant circulation system (cooling system) for the chuck top.

A third embodiment of the cooling system according to the present invention will be described with reference to FIG. 24. Description on same parts as those in the first example will be omitted.

A bypass 416 is arranged between a coolant supply pump 415 and the coupling 46c in the coolant supply section 3. A flow rate adjuster 417 is located on the line of the bypass 416 to adjust the flow rate of the coolant 44 passing through the bypass 416. A part of the coolant 44 supplied from a pump 415 to the jacket 40 is returned to the tank 43 through the bypass 416.

Figure 25:
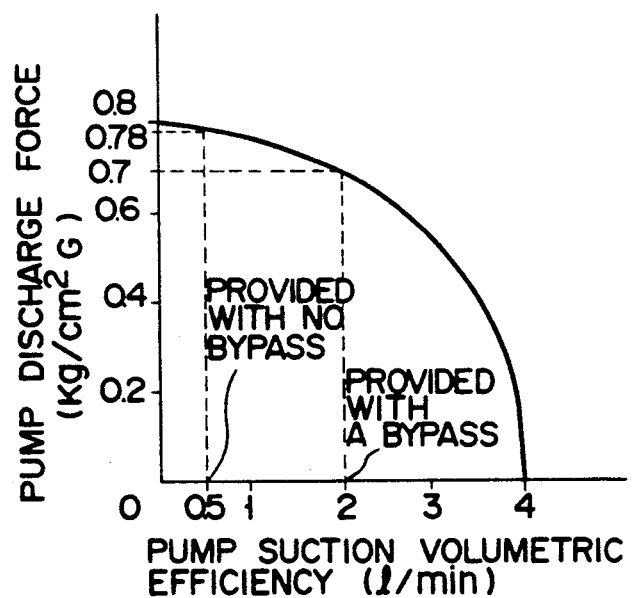
FIG. 25 is a graph showing results obtained from the third embodiment of the systems and the conventional one as to the relation between the force by which coolant is discharged by pump and the amount of coolant sucked by pump.

FIG. 25 is a graph showing results obtained from the system which had the bypass 416 and from the other system having no bypass 416. Pump suction volumetric efficiencies are plotted on the horizontal axis of the graph while pump discharge forces on the vertical axis thereof. As apparent from FIG. 25, the suction volumetric efficiency is 0.5 l/min relative to a discharge force of 0.78 kg/cm$^2$G in the case of the coolant supply system which has no bypath. In the case of the system which is provided with the bypass 416, however, the suction volumetric efficiency rises to 2 l/min when the discharge force is 0.7 kg/cm²G. As a result, the pump suction volumetric efficiency rises four times higher than in the case of the conventional system.

The coolant 44 in the tank 43 shall be sufficiently stirred by that coolant 44 which is returning to the tank 43 through the return pipe 425 and the bypass 416. This stir prevents the coolant 44 from freezing in the tank 43. The density of the coolant 44 can be thus controlled to be in a certain range. The cooling capacity of the jacket 40 can be thus kept substantially certain.

The flow rate of the coolant 44 flowing through the pump 415 is 2 l/min and a part of this coolant 44 is returned to the tank 43 through the bypath 416. The flow rate is usually proportional to the square root of a pressure difference caused by liquid resistances. When the flow rates of the coolant 44 flowing through the coupling 46c are compared, therefore, $$\sqrt{0.7/0.78} \times 0.5 = 0.47$$

l/min in a case where the conventional flow rate is 0.5 l/min. This teaches us that external load or reduction of the flow rate of the coolant 44 supplied to the jacket 40 is quite negligible. More specifically, the flow rate of the coolant 44 supplied to the jacket 40 is 0.47 l/min and the flow rate of the coolant 44 which is returned to the tank 43 through the return pipe 416 is expressed by 2.0−0.47=1.53 l/min. However, the non-freezing liquid passing through the tank 43 is increased four times. The coolant 44 can be thus prevented from freezing in the tank 43 to thereby make sufficient heat exchange available. In addition, the density of the non-freezing liquid or ethylene glycol can be reduced. When the density of ethylene glycol which was conventionally 40% (at a freezing temperature of about −25° C.) is reduced to 30% (at a freezing temperature of about −15°), the specific heat which was conventionally 0.75 Kcal/kg° C. can be raised to 0.85 Kcal/kg° C. When the specific heat is raised like this, heat exchange or cooling efficiency in the jacket 40 is increased to thereby enable a more highly reliable and stable cooling control to be attained.

The embodiments described above are machines for testing semiconductor wafers. Nevertheless, the present invention can be applied to the testing of other devices whose electrical characteristics are to be determined, such as Liquid Crystal Devices and printed circuit boards.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An apparatus for cooling a semiconductor wafer comprising:
    a wafer stage on which a semiconductor wafer is placed;
    a heat exchange jacket arranged so as to conduct heat exchange between itself and said wafer stage;
    a coolant tank in which a coolant is reserved;
    a supply passage communicating said heat exchange jacket and said coolant tank;
    a return passage communicating said heat exchange jacket and said coolant tank,
    a pair of pump means for circulating the coolant between the coolant tank and the heat exchange jacket via the supply and return passages; and
    a bypass for returning the coolant from the supply passage directly tot he coolant tank without passing through the return passage;
    wherein the discharge opening of said bypass is positioned above the surface level of the coolant housed in the coolant tank.

2. An apparatus according to claim 1, wherein said pair of pump means includes a supply pump for supplying the coolant from the coolant tank to the heat exchange jacket.

3. An apparatus according to claim 1, wherein said pair of pump means includes a return pump for returning the coolant form the heat exchange jacket to the coolant tank.

4. An apparatus according to claim 1, further comprising a heating coil immersed in the coolant in the collate tank.

5. An apparats according to claim 1, further comprising flow rate adjusting means mounted to said bypass for adjusting the flow rate of the coolant.

6. An apparats according to claim 5, further comprising control means for controlling the flow rate adjusting means based on the flow rate of the coolant within the return passage so as to control the flow rate of the coolant into the bypass.

* * * * *